US007830717B2

(12) United States Patent
Won et al.

(10) Patent No.: US 7,830,717 B2
(45) Date of Patent: Nov. 9, 2010

(54) METHOD FOR PERFORMING ERASING OPERATION IN NONVOLATILE MEMORY DEVICE

(75) Inventors: Sam Kyu Won, Yongin-si (KR); Jae Won Cha, Seoul (KR); Kwang Ho Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 150 days.

(21) Appl. No.: 12/135,835

(22) Filed: Jun. 9, 2008

(65) Prior Publication Data

US 2009/0141551 A1 Jun. 4, 2009

(30) Foreign Application Priority Data

Nov. 29, 2007 (KR) .................... 10-2007-0122622

(51) Int. Cl.
*G11C 16/04* (2006.01)
(52) U.S. Cl. ............................ 365/185.17; 365/185.24; 365/185.29; 365/185.3
(58) Field of Classification Search ............. 365/185.2, 365/185.29, 185.17, 185.18, 185.24, 18.29, 365/185.3
See application file for complete search history.

(56) References Cited

U.S. PATENT DOCUMENTS

| 6,304,486 | B1 * | 10/2001 | Yano ...................... 365/185.22 |
| 6,826,082 | B2 * | 11/2004 | Hwang et al. ............ 365/185.17 |
| 7,187,584 | B2 * | 3/2007 | Chang .................... 365/185.17 |
| 7,206,241 | B2 | 4/2007 | Kido et al. |
| 7,564,724 | B2 * | 7/2009 | Park ....................... 365/189.05 |
| 2009/0067248 | A1 * | 3/2009 | Lee ........................ 365/185.18 |

FOREIGN PATENT DOCUMENTS

| JP | 11-031392 | 2/1999 |
| KR | 1020070018216 A | 2/2007 |
| WO | WO 2006/105120 A1 | 10/2006 |

* cited by examiner

*Primary Examiner*—Pho M Luu
(74) *Attorney, Agent, or Firm*—Townsend and Townsend and Crew LLP

(57) ABSTRACT

A method for performing erasing operation in a nonvolatile memory device includes the steps of applying an erasing voltage to P-wells of a selected memory cell block which is composed of a plurality of strings in each of which a plurality of memory cells and side memory cells are connected in series; performing soft programming operation by applying a soft programming voltage to word lines of the selected memory cell block; and programming the side memory cells by applying a programming voltage to the side memory cells.

19 Claims, 4 Drawing Sheets

METHOD FOR PERFORMING ERASING OPERATION IN NONVOLATILE MEMORY DEVICE

CROSS-REFERENCES TO RELATED APPLICATIONS

The present application claims priority to Korean patent application number 10-2007-0122622, filed on Nov. 29, 2007, which is incorporated by reference in its entirety.

BACKGROUND OF THE INVENTION

The present invention relates to a method for performing erasing operations in a nonvolatile memory device, and more particularly, to a method for performing an erasing operation in a nonvolatile memory device which has a plurality of memory cells in a string structure.

In general, among nonvolatile memory devices, flash memory devices are divided into a NOR type which is mainly used for storing a small amount of data at faster speeds and a NAND type which is mainly used for storing a large amount of data. The flash memory devices perform reading operations, programming operations and erasing operations. In particular, in NAND type flash memory devices, the programming operation and the erasing operation are performed by FN (Fowler-Nordheim) tunneling which occurs in an insulation layer between the P-wells and the floating gates of memory cells. That is to say, as electrons are introduced into the floating gates of the memory cells by the FN tunneling, a programming operation of the flash memory device is performed. In the programming operation, those cells, which are selected among a plurality of memory cells included in a memory cell block, are programmed. Also, as the electrons, which are present in the floating gates of the memory cells, are discharged into the P-wells by the FN tunneling, an erasing operation of the flash memory device is performed. In the erasing operation, the data, which are stored in the memory cells included in an entire memory cell block, are simultaneously erased. That is to say, the erasing operation is performed by blocks.

FIG. 1 is a flow chart illustrating a conventional method for performing erasing operation in a nonvolatile memory device.

Referring to FIG. 1, as an erasing mode starts, pre-programming is performed to keep cells in a charge storing state so as to secure uniform erasing pulse distribution in a unit sector or a chip (step 11). Then, by applying an erasing voltage to the P-wells of a selected memory cell block, erasing operation is performed (step 12). Next, by performing a verifying operation (step 13), it is verified that memory cells are erased. At this time, if all the memory cells are erased, it is determined to be a success, otherwise, it is determined to be a fail (step 14). When it is determined to be a success, soft programming is performed (step 15). The soft programming is performed to decrease a threshold voltage distribution width so that it is possible to prevent the threshold voltage distribution of the plurality of memory cells from having a wide dispersion due to the erasing operation.

SUMMARY OF THE INVENTION

Embodiments of the present invention relate to a method for performing erasing operation in a nonvolatile memory device, in which the side memory cells respectively formed between a drain select transistor and a memory cell and between a source select transistor and a memory cell in a nonvolatile memory device are programmed when performing erasing operation, to increase threshold voltage distribution so that the leakage current of the string of a non-selected memory cell block can be reduced and thereby, the sensing margin of the programmed cells of a selected memory cell block can be improved.

In one aspect, a method for performing erasing operation in a nonvolatile memory device comprises the steps of applying an erasing voltage to P-wells of a selected memory cell block which is composed of a plurality of strings in each of which a plurality of memory cells and side memory cells are connected in series; performing soft programming operation by applying a soft programming voltage to word lines of the selected memory cell block; and programming the side memory cells by applying a programming voltage to the side memory cells.

After the step of applying the erasing voltage, the method further comprises the step of performing erasing verification to verify whether the plurality of memory cells are erased and generating an erasing fail flag when all the memory cells are not erased.

After the step of performing the soft programming operation, when threshold voltage distribution of the plurality of memory cells is higher than a target voltage, the step of programming the side memory cells is implemented, and when the threshold voltage distribution of the plurality of memory cells is lower than the target voltage, the method further comprises the step of increasing the soft programming voltage and performing again the soft programming operation.

The target voltage is set to 0 V. The step of programming the side memory cells is implemented such that threshold voltage distribution of the side memory cells is higher than a threshold voltage of the plurality of memory cells.

The side memory cells include a drain side memory cell and a source side memory cell.

A voltage of 0 V is applied to side memory cells of a non-selected memory cell block when performing programming or reading operation.

DESCRIPTION OF SPECIFIC EMBODIMENTS

Reference will now be made in greater detail to specific embodiments of the invention, examples of which are illustrated in the accompanying drawings. The present invention is limited by the following embodiments and can be realized in a variety of ways. The following embodiments are provided to disclose the present invention and to allow the person having ordinary knowledge in the art to better understand the scope of the present invention.

Figure 1:
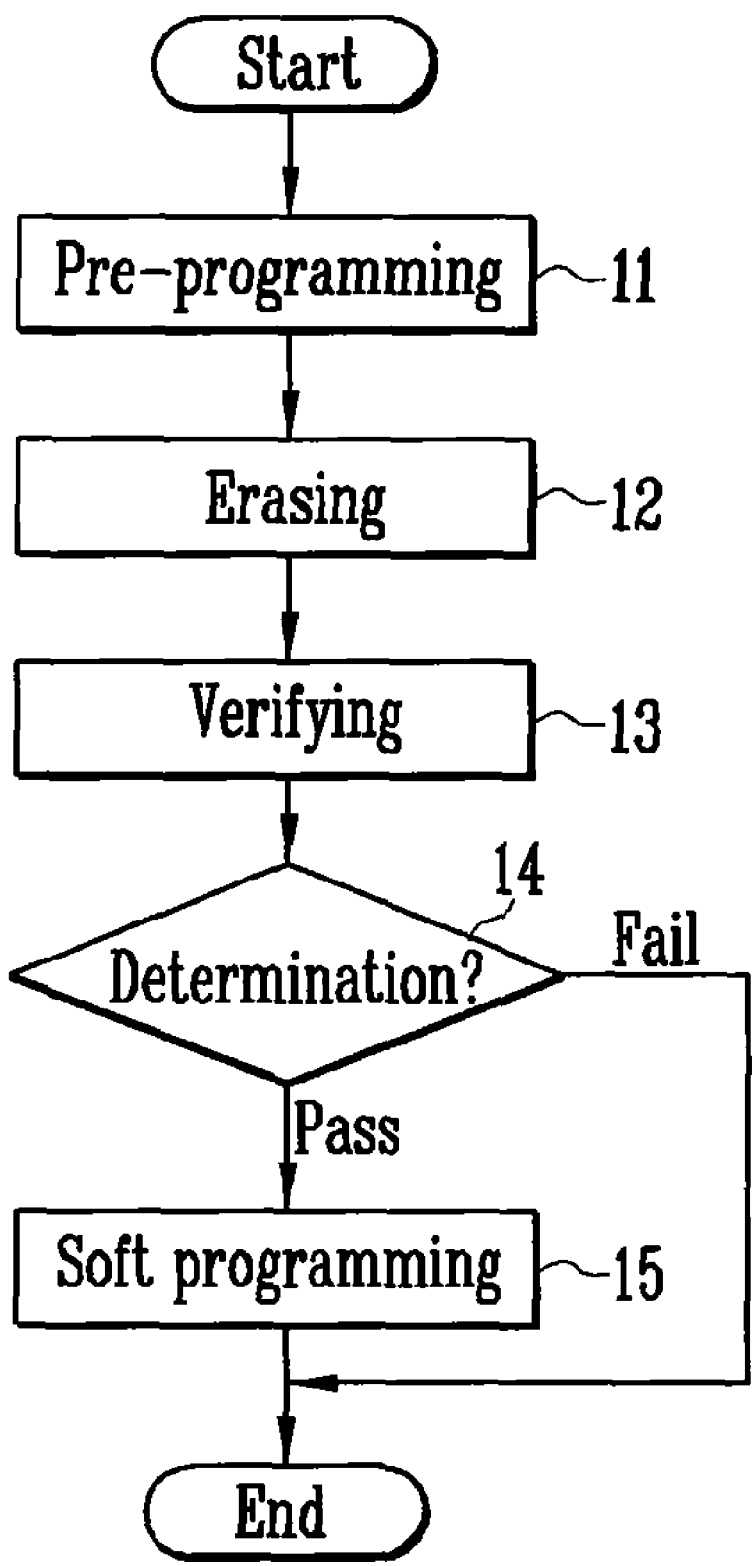
FIG. 1 is a flow chart illustrating a conventional method for performing erasing operation in a nonvolatile memory device.
Figure 2:
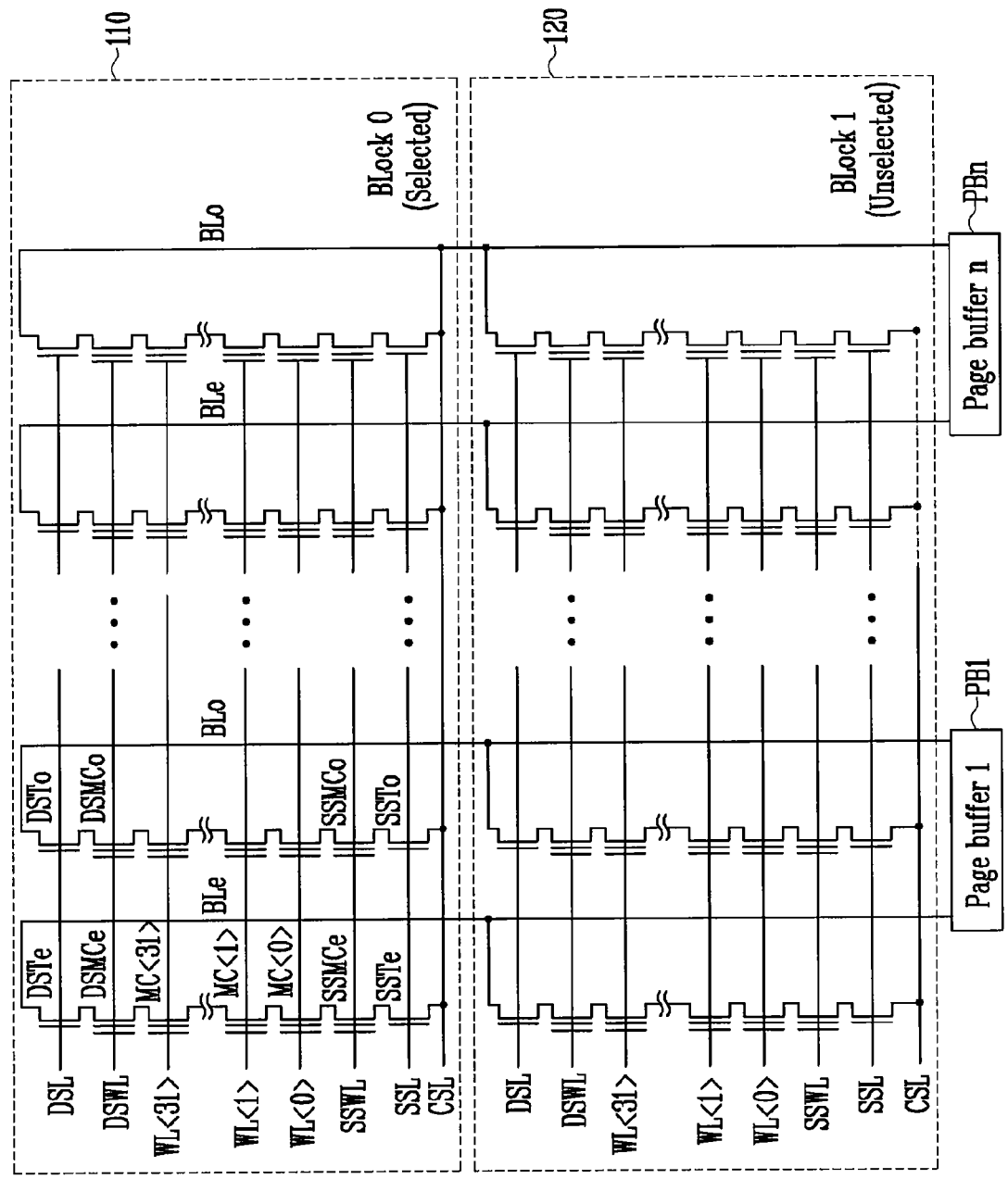
FIG. 2 is a view illustrating the configuration of a nonvolatile memory device in accordance with an embodiment of the present invention.

FIG. 2 is a view illustrating the configuration of a nonvolatile memory device in accordance with an embodiment of the present invention.

A nonvolatile memory device has a plurality of memory cell blocks 110 and 120. Pairs of even and odd bit lines BLe and BLo, which are connected to the plurality of memory cell blocks 110 and 120, are connected to a plurality of page buffers PB1 through PBn.

Each of the plurality of memory cell blocks 110 and 120 is composed of a plurality of strings in which a plurality of memory cells MC<0:31>, a drain select transistor DSTe, a source select transistor SSTe, and a drain side memory cell DSMCe and a source side memory cell SSMCe are connected in series. The drain side memory is located between the outermost memory cell MC<31> and the drain select transistor DSTe, and the source side memory cell is located between the outermost memory cell MC<0> and the source select transistor SSTe.

Figure 3:
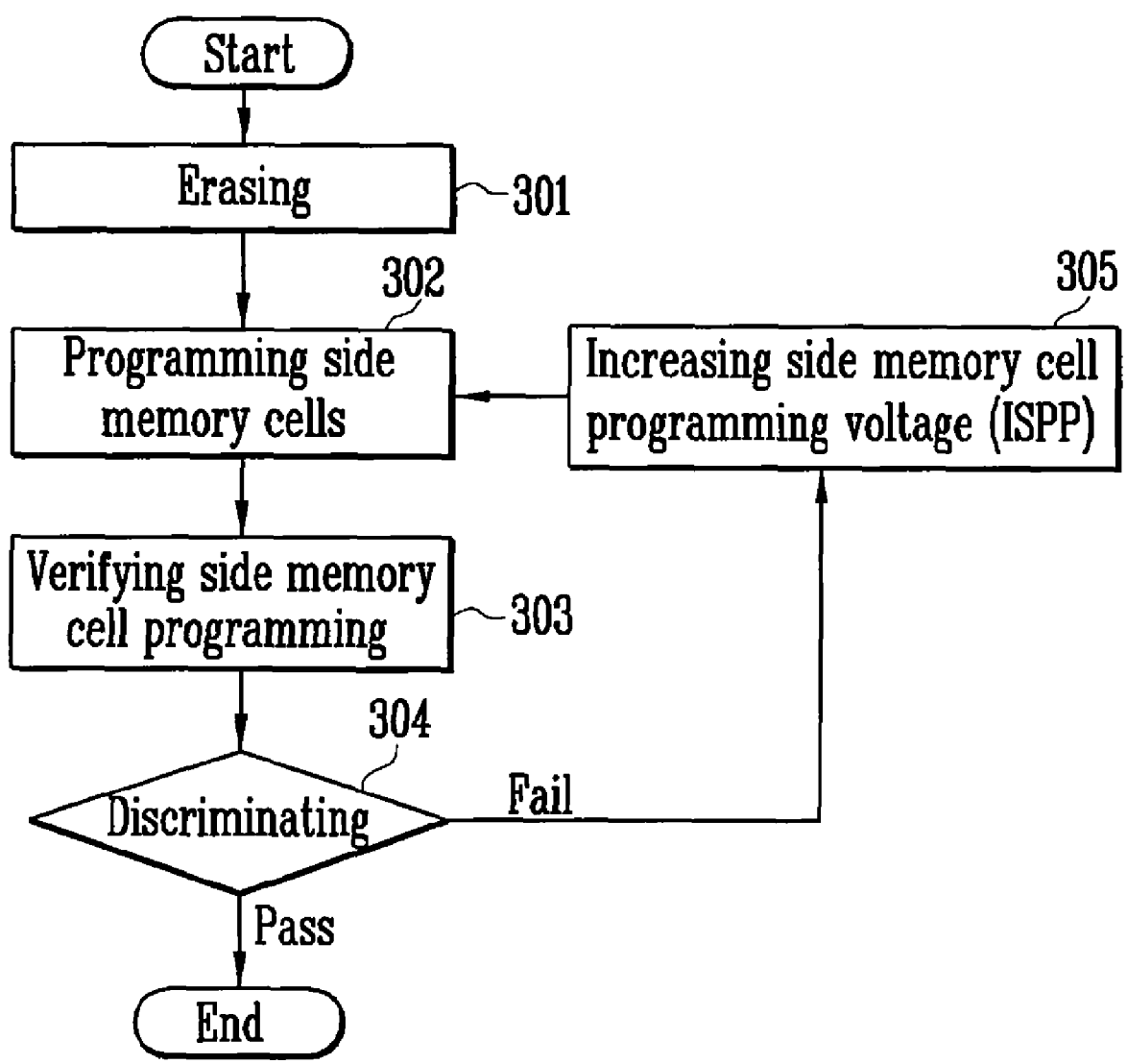
FIGS. 3 and 4 are flow charts illustrating a method for performing an erasing operation in a nonvolatile memory device in accordance with another embodiment of the present invention.
Figure 4:
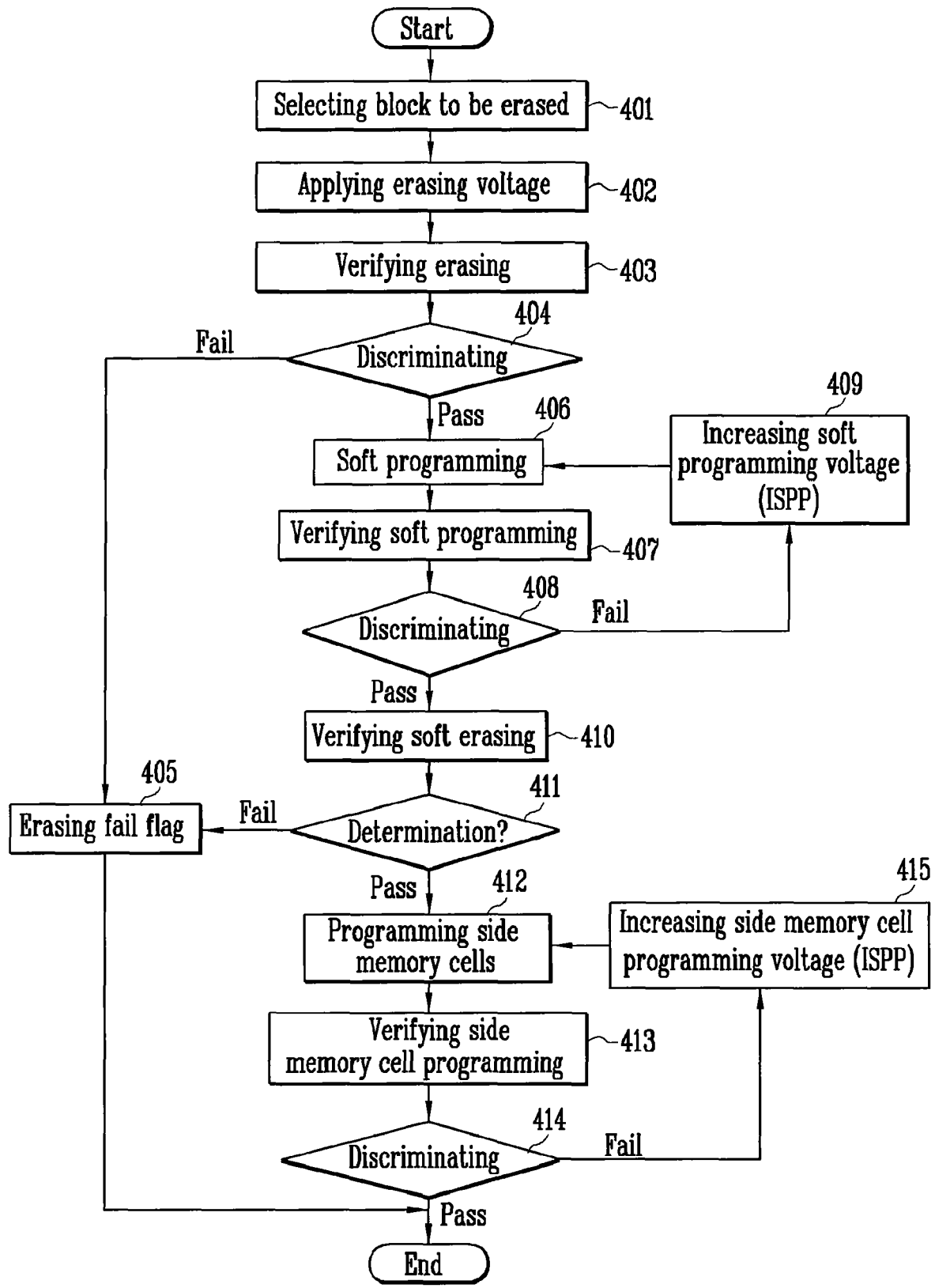

FIGS. 3 and 4 are flow charts illustrating a method for performing an erasing operation in a nonvolatile memory device in accordance with one embodiment of the present invention.

Referring to FIG. 3, an erasing operation is performed by applying an erasing voltage to a memory cell block (step 301). A programming voltage is applied to the side memory cells (e.g., DSMCe and SSMCe) of the memory cell block to program the side memory cell (step 302). The memory cells provided between the two side memory cells do not receive the programming voltage at step 302. A verifying operation to verify the programming of the side memory cells is performed (step 303). A determination is made whether or not the threshold voltage of the side memory cells is higher than a reference value (step 304). The reference voltage is set to be equal to the threshold voltage of the other memory cells (i.e., MC<0:31>). The reference voltage is 0V desirably. If the threshold voltage of the side memory cells is not higher than the reference value or the threshold voltage of the other memory cells, the programming voltage is increased and the programming operation is performed again (step 305). Steps 302 to 305 are repeated until the threshold voltages of the side memory cells are higher than the reference voltage. The higher threshold voltages of the side memory cells compared to the memory cells limits the leakage current of the memory cells. Accordingly, the side memory cells are also referred to as "control cells" herein since they are used to control the leakage current flowing through the memory cells.

This method will be described below in further detail with reference to FIGS. 2 and 4.

At step 401, a memory cell block on which an erase operation is to be performed is selected by inputting the address of the memory cell block.

An erasing voltage is applied to the P-wells of a semiconductor substrate at the location of the selected memory cell block (step 402). The plurality of memory cells MC<0:31>, the drain side memory cells DSMCe, and the source side memory cells SSMCe are erased.

The page buffers PB1 through PBn which are connected to the even and odd bit lines BLe and BLo of the memory cell block are used to verify whether the plurality of memory cells MC<0:31>, the drain side memory cells DSMCe and the source side memory cells SSMCe are properly erased (step 403).

If the plurality of memory cells MC<0:31>, the drain side memory cells DSMCe and the source side memory cells SSMCe are verified to have been properly erased, the erase operation of step 402 is determined to be a pass (step 404). Otherwise, if a certain number of the plurality of memory cells MC<0:31>, the drain side memory cells DSMCe and the source side memory cells SSMCe is determined not to have been erased properly, an erasing fail flag is generated (step 405). This certain number may vary depending on application, i.e., it may be one or more.

At step 406, a soft programming operation is performed by applying a soft programming voltage to the word lines which are connected to the plurality of memory cells MC<0:31>, the drain side memory cells DSMCe and the source side memory cells SSMCe of the memory cell block having undergone the erasing operation of step 402.

A soft programming verification is performed (step 407). The highest threshold voltage in the threshold voltage distribution associated with the plurality of memory cells MC<0:31> is compared with a target threshold voltage. For example, if the target threshold voltage (or reference voltage) is set to 0 V, it is verified whether the highest threshold voltage in the threshold voltage distribution after the erasing operation is higher than 0 V.

At step 408, if the lowest threshold voltage in the threshold voltage distribution is higher than the target threshold voltage, the soft programming of step 406 is determined to be a pass. On the other hand, if it is verified that the lowest threshold voltage is not higher than the target threshold voltage, the soft programming is determined to be a fail. If so, the programming voltage applied in the soft programming operation is increased by a predetermined level and the soft programming operation of step 406 is performed again.

At step 410, a soft erase verification is performed if the determination is a pass at step 408. The highest threshold voltage in the threshold voltage distribution is compared with the target threshold voltage.

At step 411, if the highest threshold voltage in the threshold voltage distribution is lower than the target threshold voltage, the soft erase verification is determined to be a pass. If not, the soft erase verification is determined to be a fail, and an erasing fail flag is generated (step 405).

At step 412, a programming voltage is applied to the word lines that are connected to the drain side memory cells DSMCe and the source side memory cells SSMCe. In the present embodiment, the drain side memory cells DSMCe is provided between an outermost memory cell MC<31> and the drain select transistor DSTe, and the source side memory cell SSMCe is provided between an outermost cell MC<0> and the source select transistor. At this time, both the drain side memory cells DSMCe and the source side memory cells SSMCe are be programmed. Alternatively, only one of them may be programmed in certain embodiments.

At step 413, the programming of the side memory cells is verified. The threshold voltage of the drain side memory cells DSMCe and/or the source side memory cells SSMCe is compared with a target threshold voltage (or reference voltage).

If the threshold voltage of the drain side memory cells DSMCe or the source side memory cells SSMCe is lower than the target threshold voltage, the programming of the side memory cells is determined to be a fail (step 414). The programming voltage in the side memory cell programming operation is increased by a predetermined level (step 415), as in an ISPP programming method. The side memory cell programming operation of step 412 is performed again.

Referring back to step 414, if the threshold voltages of or DSMCe and SSMCe are higher than the target threshold voltage, the programming of the side memory cells is determined to be a pass. The entire erasing operation ends. The target threshold voltage is set to be 0 V or greater in the present embodiment. In another embodiment, the determination of a pass is issued if the threshold voltage of one of the DSMCe and SSMCe is higher than the target threshold voltage.

As described above, by programming the drain side memory cells DSMCe and the source side memory cells SSMCe, threshold voltage distribution no less than 0 V is accomplished. Therefore, due to the fact that the threshold voltage of the drain side memory cell DSMCe or the source side memory cell SSMCe is greater than that of the memory cells, when subsequently performing a programming operation or reading operation in a nonvolatile memory device, in the case that a 0 V voltage is applied to the drain side memory cell DSMCe or the source side memory cell SSMCe of a non-selected memory cell block, the drain side memory cell DSMCe or the source side memory cell SSMCe is maintained in a turned-off state since the threshold voltage of the drain side memory cell DSMCe or the source side memory cell SSMCe is no less than 0 V. Consequently, the leakage current flowing through the string of the non-selected memory cell block can be reduced.

Due to the features of the present invention, the side memory cells respectively formed between a drain select transistor and a memory cell and between a source select transistor and a memory cell in a nonvolatile memory device are programmed when performing an erasing operation, to increase threshold voltage distribution so that the leakage current of the string of a non-selected memory cell block can be reduced and thereby, the sensing margin of the programmed cells of a selected memory cell block can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for operating a nonvolatile memory device, the method comprising:
    applying an erase voltage to a memory cell block having at least one string, the string including first and second control cells and a plurality of memory cells provided between the first and second control cells; and
    applying a first voltage to the first and second control cells so that first and second threshold voltages of the first and second control cells are higher than a reference voltage.

2. The method of claim 1, wherein the memory cells have a threshold voltage distribution after the erase voltage is applied to the memory cell block, and
    wherein the reference voltage is higher than the highest threshold voltage in the threshold voltage distribution of the memory cells.

3. The method of claim 2, wherein the reference voltage is 0V.

4. The method according to claim 1, wherein the first voltage applied to the control cells is a programming voltage.

5. The method according to claim 1, wherein the control cells include a drain side memory cell provided between the drain select transistor and the memory cells and a source side memory cell provided between the source select transistor and the memory cells.

6. The method of claim 1, wherein the first and second control cells are programmed to have a higher threshold voltage than any of the memory cells.

7. The method of claim 1, further comprising:
    applying a second voltage to the first and second control cells if the first and second threshold voltages of the first and second controls cells are determined to be not higher than the reference voltage.

8. The method of claim 1, wherein the first and second control cells have substantially the same feature size as the memory cells.

9. The method of claim 1, wherein the first control cell is provided adjacent to the drain select transistor.

10. The method of claim 8, wherein the second control cell is provided adjacent to the source select transistor.

11. The method of claim 1, wherein the method is performed as part of an erase operation.

12. A method for operating a nonvolatile memory device, the method comprising:
    applying an erasing voltage to a selected memory cell block comprising a plurality of strings, each string having a plurality of memory cells and control cells connected in series;
    performing soft programming operation by applying a soft programming voltage to word lines of the selected memory cell block; and
    programming the control cells by applying a programming voltage to the control cells.

13. The method according to claim 12, further comprising:
    after applying the erasing voltage, performing erasing verification to verify whether the plurality of memory cells are erased and generating an erasing fail flag when all the memory cells are not erased.

14. The method according to claim 12, further comprising:
    after performing the soft programming operation, programming the side memory cells; and
    when a threshold voltage distribution of the plurality of memory cells is lower than the target voltage, increasing the soft programming voltage and performing again the soft programming operation.

15. The method according to claim 14, wherein the target voltage is set to 0 V.

16. The method according to claim 12, wherein the step of programming the control cells is implemented such that a threshold voltage distribution of the control cells is higher than a threshold voltage of the plurality of memory cells.

17. The method according to claim 12, wherein the control cells include a drain side memory cell and a source side memory cell.

18. The method according to claim 12, wherein a voltage of 0 V is applied to control cells of a non-selected memory cell block when performing a program or read operation.

19. A method for performing erasing operation in a nonvolatile memory device, the method comprising:
    applying an erasing voltage to a selected memory cell block comprising a plurality of strings, each string including a plurality of memory cells and control cells connected in series; and
    programming the control cells such that a threshold voltage distribution of the control cells is higher than 0 V.

* * * * *